(12) United States Patent
Ishida et al.

(10) Patent No.: US 9,306,153 B2
(45) Date of Patent: Apr. 5, 2016

(54) THERMOELECTRIC CONVERSION ELEMENT AND METHOD FOR MANUFACTURING THE SAME

(71) Applicant: NEC Corporation, Tokyo (JP)

(72) Inventors: Masahiko Ishida, Tokyo (JP); Akihiro Kirihara, Tokyo (JP); Shigeru Koumoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 14/425,188

(22) PCT Filed: Apr. 15, 2013

(86) PCT No.: PCT/JP2013/061225
§ 371 (c)(1),
(2) Date: Mar. 2, 2015

(87) PCT Pub. No.: WO2014/041838
PCT Pub. Date: Mar. 20, 2014

(65) Prior Publication Data
US 2015/0236246 A1 Aug. 20, 2015

(30) Foreign Application Priority Data

Sep. 12, 2012 (JP) ................. 2012-200535

(51) Int. Cl.
*H01L 43/04* (2006.01)
*H01L 35/02* (2006.01)
*H01L 35/34* (2006.01)
*H01L 43/14* (2006.01)
*H01L 43/06* (2006.01)

(52) U.S. Cl.
CPC ............... *H01L 43/04* (2013.01); *H01L 35/02* (2013.01); *H01L 35/34* (2013.01); *H01L 43/06* (2013.01); *H01L 43/14* (2013.01)

(58) Field of Classification Search
None
See application file for complete search history.

(56) References Cited

U.S. PATENT DOCUMENTS

| 2010/0276770 | A1 | 11/2010 | Uchida et al. | |
| 2014/0182645 | A1* | 7/2014 | Kirihara | H01L 37/00 136/201 |
| 2014/0224294 | A1* | 8/2014 | Koumoto | H01L 37/00 136/205 |
| 2014/0230873 | A1* | 8/2014 | Kirihara | H01L 37/00 136/205 |
| 2015/0194587 | A1* | 7/2015 | Kirihara | H01L 37/00 136/205 |

FOREIGN PATENT DOCUMENTS

JP 2009-130070 A 6/2009

OTHER PUBLICATIONS

International Search Report corresponding to PCT/JP2013/061225, dated Jul. 9, 2013 (4 pages).

(Continued)

*Primary Examiner* — Minh-Loan Tran
(74) *Attorney, Agent, or Firm* — Wilmer Cutler Pickering Hale and Dorr LLP

(57) ABSTRACT

A thermoelectric conversion element includes a magnetic layer which has a component magnetized in an in-plane direction, an electromotive layer which includes a material with spin orbit coupling, and a spin injection layer. The spin injection layer is provided between the magnetic layer and the electromotive layer and magnetically coupled to both the magnetic layer and the electromotive layer. A magnetic moment per unit volume of the spin injection layer is smaller than the magnetic moment per unit volume of the magnetic layer.

6 Claims, 3 Drawing Sheets

(56) References Cited

OTHER PUBLICATIONS

Uchida et al., "Spin Seebeck insulator", Nature Materials, 2010, vol. 9, p. 894-897.

Uchida et al., "Observation of longitudinal spin-Seebeck effect in magnetic insulators", Applied Physics Letters, 2010, vol. 97, 172505 (4 pages).

Heinrich et al., "Spin Pumping at the Magnetic insulator (YIG)/NormalMetal (Au) Interfaces", Physical Review Letters, 2011, vol. 107, p. 066604 (4 pages).

Burrowes et al., "Enhancement spin pumping at yttrium iron garnet/Au interfaces", Applied Physics Letters, 2012, vol. 100, p. 092403 (5 pages).

Jia et al., "Spin transfer torque on magnetic insulators", Europhysics Letters, 2011, vol. 96, p. 17005 (7 pages).

Uchida et al., "Electric detection of the spin-Seebeck effect in magnetic insulator in the presence of interface barrier", Journal of Physics: Conference series, Jul. 2011, vol. 303, Issue 1, 012096 (5 pages).

\* cited by examiner

THERMOELECTRIC CONVERSION ELEMENT AND METHOD FOR MANUFACTURING THE SAME

CROSS-REFERENCE TO RELATED APPLICATIONS

This application is a national stage application of International Application No. PCT/JP2013/061225 entitled "Thermoelectric Conversion Element and Method for Manufacturing the Same," filed on Apr. 15, 2013, which claims the benefit of the priority of Japanese Patent Application No. 2012-200535, filed on Sep. 12, 2012, the disclosures of each of which are hereby incorporated by reference in their entirety.

TECHNICAL FIELD

The present invention relates to a thermoelectric conversion element using the spin-Seebeck effect and the inverse spin-Hall effect and a method for manufacturing the same.

BACKGROUND ART

In recent years, an electronic technology called "spintronics" has received attention. Until now, in an electronics area, only the "electric charge" that is one of properties of an electron is used. However, in spintronics technology, a spin that is another property of an electron is proactively used in addition to the electric charge. In particular, a "spin-current" that is a flow of spin angular momentum of the electron is an important concept. Because energy dissipation of the spin-current is small, there is a possibility that highly-efficient information transmission can be realized by using the spin-current. Accordingly, the generation, the detection, and the control of spin-current are important themes.

For example, a phenomenon in which when an electric current flows, the spin-current is generated is known. This is called "spin-Hall effect". Further, as a converse phenomenon, a phenomenon in which when the spin-current flows, an electromotive force is generated is known. This is called "inverse spin-Hall effect". By using the inverse spin-Hall effect, the spin-current can be detected. Further, the spin-Hall effect and the inverse spin-Hall effect significantly appears in a material (for example: Pt and Pd) with large spin orbit coupling.

In recent studies, it is shown that the spin-Seebeck effect appears in magnetic materials. The spin-Seebeck effect is a phenomenon in which when a temperature gradient is applied to the magnetic material, the spin-current is induced in a direction parallel to the temperature gradient (refer to for example, patent literature 1, non-patent literature 1, and non-patent literature 2). Namely, heat is converted into the spin current (heat to spin current conversion) by the spin-Seebeck effect. In patent literature 1, it is shown that the spin-Seebeck effect appears in an NiFe film that is a ferromagnetic metal. In non-patent literatures 1 and 2, it is shown that the spin-Seebeck effect is observed by using a magnetic insulating material such as yttrium-iron garnet (YIG, $Y_3Fe_5O_{12}$) and a metallic film.

Further, the spin-current induced by the temperature gradient can be converted into an electric field (an electric current and an electric voltage) by using the inverse spin-Hall effect mentioned above. Namely, by using both the spin-Seebeck effect and the inverse spin-Hall effect, "thermoelectric conversion" in which the temperature gradient is converted into electricity can be achieved.

FIG. 1 shows a structure of a thermoelectric conversion element disclosed in patent literature 1. A thermal spin current conversion section 102 is formed on a sapphire substrate 101. The thermal spin current conversion section 102 has a layered structure in which a Ta film 103, a PdPtMn film 104, and a NiFe film 105 are stacked. The NiFe film 105 has magnetization in an in-plane direction. Further, a Pt film 106 is formed on the NiFe film 105 and the both ends of the Pt film 106 are connected to terminals 107-1 and 107-2, respectively.

In the thermoelectric conversion element having the above-mentioned structure, the NiFe film 105 acts a role of generating the spin-current from the temperature gradient by the spin-Seebeck effect and the Pt film 106 acts a role of generating the electromotive force from the spin-current by the inverse spin-Hall effect. Specifically, when the temperature gradient is applied in the in-plane direction of the NiFe film 105, the spin-current is generated in a direction parallel to the temperature gradient by the spin-Seebeck effect. At this time, the spin-current flows to the Pt film 106 from the NiFe film 105 or the spin-current flows to the NiFe film 105 from the Pt film 106. In the Pt film 106, the electromotive force is generated in a direction that is perpendicular to a spin-current direction and an NiFe magnetization direction by the inverse spin-Hall effect. The electromotive force can be taken out from the terminals 107-1 and 107-2 provided to the both ends of the Pt film 106.

The magnitude of the electromotive force obtained by the above-mentioned thermoelectric conversion element depends on the following three parameters: (1) the magnitude of the spin-current generated in the magnetic film, (2) a spin injection efficiency that is an injection efficiency of the spin-current at an interface between the magnetic film and the metal film, and (3) an electromotive force conversion efficiency that is an efficiency of converting the spin-current into the electromotive force in the metallic film by the inverse spin-Hall effect. Accordingly, in order to realize a spin-current thermoelectric conversion element which can generate a large output power, all three parameters have to be increased.

The following technology is known as the technology to improve the spin injection efficiency among these three parameters.

In non-patent literature 3, a result of investigating the spin-current generated at the interface between the YIG film that is the magnetic film and a Au film that is the metallic film by using a ferromagnetic resonance (FMR) method is shown. According to the result, when a YIG/Au/Fe/Au structure in which the Au film with a thickness smaller than a spin diffusion length (35 nm) is sandwiched between the YIG film and the Fe thin film is used, the large spin-current can be obtained.

In non-patent literature 4, a YIG/Au/Fe/Au multilayered structure is shown. When this multilayered structure is produced, the interface is cleaned by an Ar ion sputter. By this process, the spin-current increases by five times (maximum) in comparison with a case of a YIG/Au structure that is not a multilayered structure.

Non-patent literature 5 discloses the results of the first-principles calculation showing that in case of the YIG/Fe/Ag structure, a spin mixing conductance (a parameter which contributes to the spin injection efficiency) increases by 65% (maximum) according to a magnetic moment density per unit area of the interface between YIG and Ag. By this result, it is suggested that the density of iron atoms at the interface involves increase and decrease of the spin mixing conductance. Further, non-patent literature 4 discloses the experimental result showing that in the YIG/Fe/Au structure, when the thickness of the Fe film is thin and approximately equal to the thickness of one atomic layer, the spin injection efficiency does not change but when it is greater than the thickness of one atomic layer, the spin injection efficiency decreases because it blocks the spin-current.

CITATION LIST

Patent Literature

[PTL] 1: Japanese Patent Application Laid-Open No. 2009-130070

Non Patent Literature

[NPL 1]: Uchida et al., "Spin Seebeck insulator", Nature Materials, 2010, vol. 9, p.894.
[NPL 2]: Uchida et al., "Observation of longitudinal spin-Seebeck effect in magnetic insulators", Applied Physics Letters, 2010, vol. 97, p172505.
[NPL 3]: Heinrich et al., "Spin Pumping at the Magnetic insulator (YIG)/NormalMetal (Au) Interfaces", Physical Review Letters, 2011, vol. 107, p066604.
[NPL 4]: Burrowes et al., "Enhancement spin pumping at yttrium iron garnet/Au interfaces", Applied Physics Letters, 2012, vol. 100, p092403.
[NPL 5]: Jia et al., "Spin transfer torque on magnetic insulators", Europhysics Letters, 2011, vol. 96, p17005.

SUMMARY OF INVENTION

One object of the present invention is to provide a technology which can improve a spin injection efficiency in a thermoelectric conversion element using spin-current.

Solution to Problem

In one viewpoint of the present invention, a thermoelectric conversion element is provided. The thermoelectric conversion element includes a magnetic layer which has a component magnetized in an in-plane direction, an electromotive layer which includes a material with spin orbit coupling, and a spin injection layer. The spin injection layer is provided between the magnetic layer and the electromotive layer and magnetically coupled to both the magnetic layer and the electromotive layer. The magnetic moment per unit volume of the spin injection layer is smaller than the magnetic moment per unit volume of the magnetic layer.

In another viewpoint of the present invention, a method for manufacturing a thermoelectric conversion element is provided. The method includes a step in which a magnetic layer which has a component magnetized in an in-plane direction is formed, a step in which an electromotive layer which includes a material with spin orbit coupling is formed, and a step in which a spin injection layer is formed. The spin injection layer is formed between the magnetic layer and the electromotive layer and magnetically coupled to both the magnetic layer and the electromotive layer. The magnetic moment per unit volume of the spin injection layer is smaller than the magnetic moment per unit volume of the magnetic layer.

Advantageous Effects of Invention

By using the present invention, the spin injection efficiency in the thermoelectric conversion element using spin-current can be improved.

DESCRIPTION OF EMBODIMENTS

Figure 1:
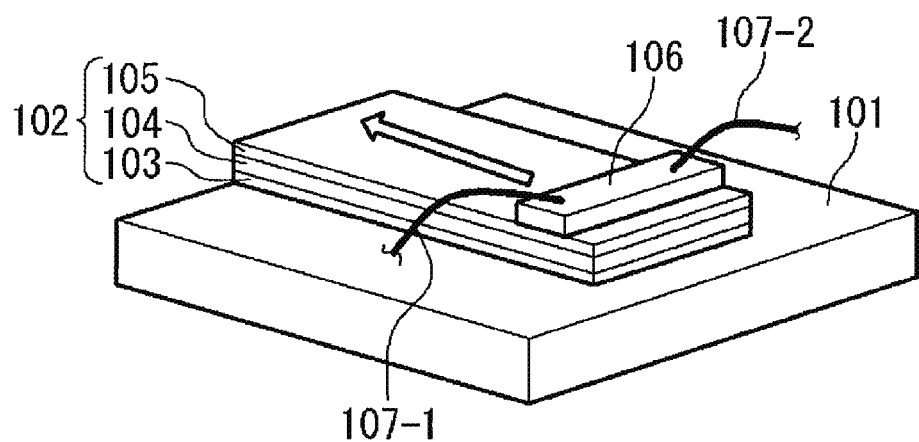
FIG. 1 is a perspective view schematically showing a thermoelectric conversion element described in patent literature 1.
Figure 2:
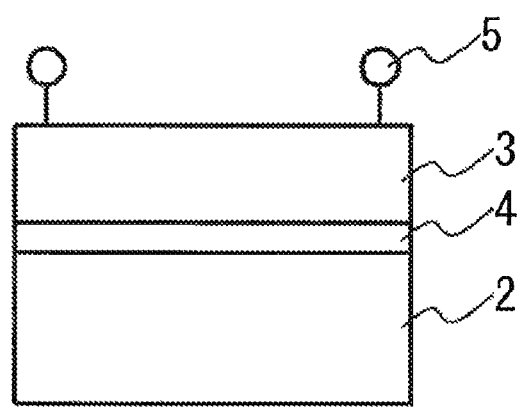
FIG. 2 schematically shows a structure of a thermoelectric conversion element according to an exemplary embodiment of the present invention.

An exemplary embodiment of the present invention will be described with reference to the accompanying drawing.
1. Structure of thermoelectric conversion element
1-1. A basic structural drawing
FIG. 2 schematically shows a spin-current induced thermoelectric conversion element 1 according to an exemplary embodiment of the present invention. As a basic structure, the spin-current induced thermoelectric conversion element 1 consists of a magnetic layer 2, an electromotive layer 3, and an electric power output terminal 5.

The magnetic layer 2 has a component magnetized in the in-plane direction. The magnetic layer 2 is formed of a material in which the spin Seebeck effect appears and generates the spin-current when the temperature gradient is applied. Either a ferromagnetic metal or a magnetic insulating material can be used as a material of the magnetic layer 2. As the ferromagnetic metal, NiFe, CoFe, CoFeB, or the like can be used. As the magnetic insulating material, yttrium-iron garnet (YIG, $Y_3Fe_5O_{12}$), bismuth(Bi)-doped yttrium-iron garnet (Bi:YIG), lanthanum(La)-doped yttrium-iron garnet ($LaY_2Fe_5O_{12}$), yttrium gallium iron garnet ($Y_3Fe_{5-x}Ga_xO_{12}$), or the like can be used. Further, from a viewpoint of suppressing thermal conductivity due to electrons, it is desirable to use the magnetic insulating material.

The electromotive layer 3 converts the generated spin-current into an electromotive force. This electromotive layer 3 is formed of a material in which the inverse spin-Hall effect (the spin orbit coupling) appears. In more detail, the material of the electromotive layer 3 contains a metal with large spin orbit coupling. For example, Au or Pt that is a material with a relatively large spin orbit coupling, a transition metal with a d orbit or an f orbit such as Pt, Pd, Ir, or the like, or an alloy containing these metals. Further, even when a material such as Au, Pt, Pd, Ir, or the like is doped to a general metallic film material such as Cu or the like by about 0.5 to 10%, the same effect can be obtained. When W, Ta, Mo, Nb, Cr, V, or Ti of the transition metal is used, a voltage whose polarity is opposite to the polarity generated when Au, Pt, Pd, Ir, or the alloy containing these metals is used can be obtained. In these metals, the price of W or Ta is lower than that of Pt or Pd and W or Ta has excellent durability. Further, Pt has the best spin current-electric current conversion efficiency and W and Ta have the second-best efficiency. Therefore, W and Ta are good materials. Further, the electromotive layers 3 may be made of an oxide such as ITO or the like or a semiconductor. Further, from a viewpoint of efficiency, it is desirable to set the thickness of the electromotive layer 3 to about a "spin diffusion length (spin relaxation length)" that depended on the material. For example, when the electromotive layer 3 is formed of a Pt film, it is desirable to set the thickness of the Pt film to about 10 to 30 nm.

The electric power output terminal 5 is provided to take out the electromotive force generated in the electromotive layer 3.

Figure 3:
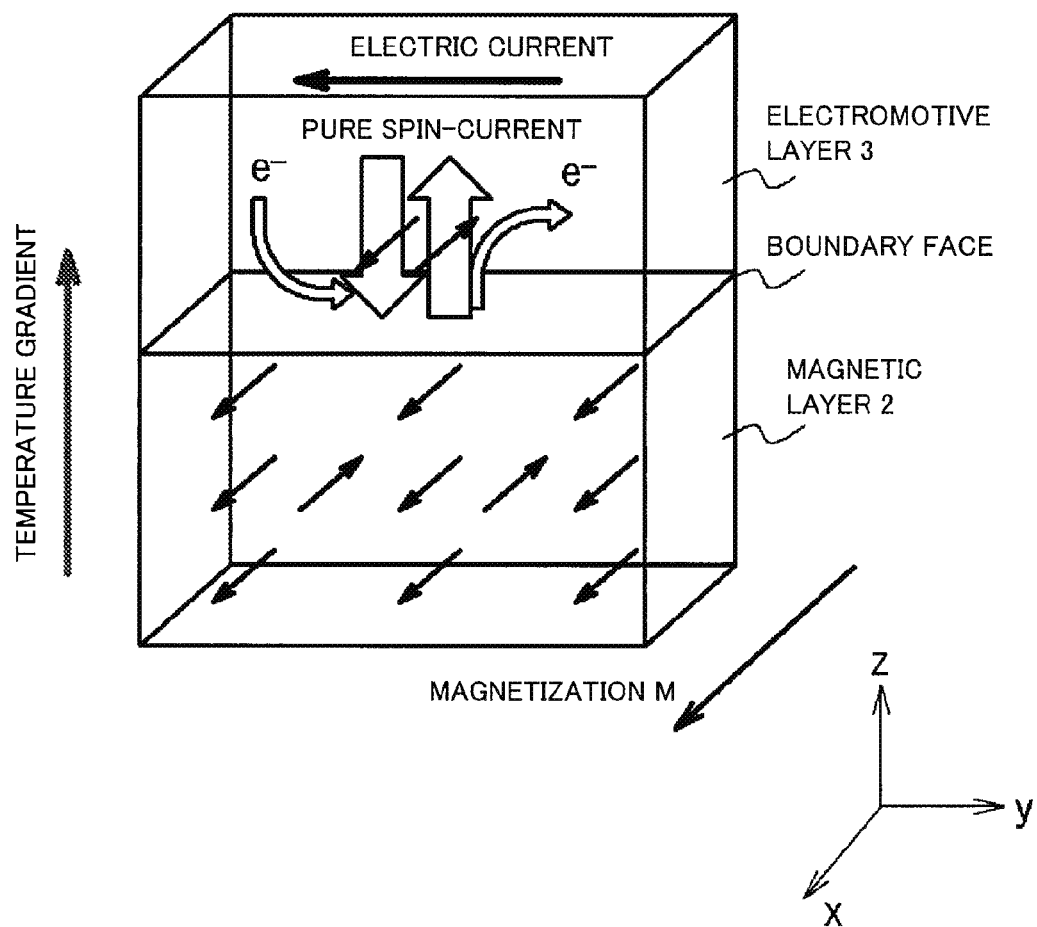
FIG. 3 is a conceptual rendering for explaining a principle of a thermoelectric conversion element according to an exemplary embodiment of the present invention.

FIG. 3 is an outline drawing illustrating a thermal spin current-electromotive force conversion in the spin-current induced thermoelectric conversion element 1 having the basic structure mentioned above. The magnetic layer 2 has magnetization M in an x direction. The electromotive layer 3 is formed on the magnetic layer 2. A case in which the temperature gradient is applied to the layered structure in which the magnetic layer 2 and electromotive layer 3 are stacked in a direction (z direction) perpendicular to a surface is considered. In this case, the spin-current is generated by the interaction between the spins of the magnetic layer 2 and the spin injection occurs at the interface between the magnetic layer 2 and the electromotive layer 3 so as to transfer spin angular momentum to the conduction electron of the electromotive layer 3. As a result, a "pure spin-current" which does not involve an electric current is generated in the electromotive layer 3. Further, by the inverse spin-Hall effect in the electromotive layer 3, a part of the pure spin-current is converted into the electric current (the electromotive force) that flows in the negative y direction.

In the pure spin-current injected into the electromotive layer 3, a flow direction of an up-spin is opposite to a flow direction of a down-spin but the absolute amount of the up-spin is equal to that of the down-spin. On the one hand, the magnetic layer 2 which achieves the spin injection has a certain magnitude of the magnetic moment and a localized spin located near the interface is polarized very much. Accordingly, the actual spin injection efficiency is restricted by the amount of the spins with a direction in which the amount is small at the interface. In order to suppress the reduction of the spin injection efficiency, a "spin injection layer 4" is further provided in the spin-current thermoelectric conversion element 1 according to this exemplary embodiment (refer to FIG. 2).

1-2. Spin Injection Layer 4

As shown in FIG. 2, the spin injection layer 4 is provided as an interface for improving the spin injection efficiency from the magnetic layer 2 to the electromotive layer 3. Therefore, the spin injection layer 4 is formed between the magnetic layer 2 and the electromotive layer 3. Typically, the spin injection layer 4 is formed so that the spin injection layer 4 is in contact with both the magnetic layer 2 and the electromotive layer 3. However, another structure can be used Further, the spin injection layer 4 is formed so that the spin injection layer 4 is magnetically coupled to both the magnetic layer 2 and the electromotive layer 3. Here, the magnetically coupled state means a state in which the spin angular momentum can be transferred. The spin angular momentum is transferred by the following causes: (1) transfer caused by the movement of the spin-polarized conduction electron or hole, (2) transfer caused by the pure spin-current (a state in which the conduction electron or the hole with the spin moves, and only the spin-current flows, whereas the electric current does not flow), and (3) transfer of the spin wave or the magnon generated by the interaction between the spins, transfer of the spin-density wave, or the like. Therefore, in order to realize the state in which the spin injection layer 4 is magnetically coupled to both the magnetic layer 2 and the electromotive layer 3, it is not necessarily required that the spin injection layer 4 is in contact with both the magnetic layer 2 and the electromotive layer 3. When the tunneling of spin carriers through the barrier or the spin-to-spin interaction is realized, the spin injection layer 4 may be slightly separated from both the magnetic layer 2 and the electromotive layer 3.

The characteristic of the spin injection layer 4 is shown below. As described above, in the pure spin-current injected into the electromotive layer 3, the flow direction of the up-spin is opposite to the flow direction of the down-spin but the absolute amount of the up-spin is equal to that of the down-spin. When the localized spin is largely polarized in the side in which the spin injection is achieved, the actual spin injection efficiency is restricted by the amount of the spins with a direction in which the amount is small. Accordingly, for example, an antiferromagnetic material in which the amount of the up-spin is equal to the amount of the down-spin may be used as the spin injection layer 4. By this method, it is possible to suppress the reduction of efficiency of injecting the pure spin-current into the electromotive layer 3.

Further, according to this principle, it is not necessarily required that the amount of the up-spin is equal to the amount of the down-spin in the spin injection layer 4. A "ferri-magnetic material" in which the amount of the up-spin is not equal to the amount of the down-spin and which has a net magnetic moment (magnetization) can be used for the spin injection layer 4. However, in order to improve the spin injection efficiency in comparison with the case of the layered structure in which the magnetic layer 2 and the electromotive layer 3 are simply stacked, it is desirable that the magnetic moment per unit volume (unit cell) of the spin injection layer 4 is smaller than that of the magnetic layer 2.

However, it is not desirable to use a non-magnetic material which has few spin for the spin injection layer 4. It is desirable to use the ferri-magnetic material, the antiferromagnetic material, or the like in which only the macro magnetic moment is small because the spin is oriented in an antiparallel direction by a superexchange interaction or the like although it is the magnetic material in which an electron or an atomic nucleus with the spin exists like the magnetic layer.

Further, when the principle of the spin injection disclosed in non-patent document 5 is taken into consideration, the larger absolute amount of the spin contacting to the interface between the magnetic material and the electromotive material of the spin-current thermoelectric conversion element, in other words, the larger amount of the spin in which the direction (sign) is not taken into consideration is desirable. Accordingly, similarly, with respect to the spin injection layer 4, the larger absolute amount of the spin is desirable.

Therefore, it is desirable that at least one of an up-spin density and a down-spin density of the spin injection layer 4 is greater than a corresponding spin density of the magnetic layer 2.

As a specific example of the material used for the spin injection layer 4, the following materials can be used: a transition metal or a rare-earth metal having the d orbit or the f orbit in the outer shell, an alloy containing these metals, an oxide including at least one of the transition metal and the rare-earth metal, a carbide, a nitride, or the like. Specifically, manganese, chrome, an alloy ($Mn_{80}Ir_{20}$ or the like) of manganese and iridium, an oxide containing manganese, iron, cobalt, and nickel that is called a ferrite, or the like can be used.

Further, when the magnetic layer 2 is made of the ferromagnetic metal, the spin injection layer 4 may be formed of an insulating material. When the electric current generated in the electromotive layer 3 flows into the magnetic layer 2, the electric power output is reduced. However, when the above-mentioned method is used, the reduction of the electric power output can be prevented. Namely, substantially, the reduction of the electromotive force conversion efficiency can be prevented. Therefore, this is a suitable method.

As described above, the spin injection layer 4 is provided in the spin-current thermoelectric conversion element 1 according to this exemplary embodiment. The magnetic moment per unit volume of the spin injection layer 4 is smaller than the magnetic moment per unit volume of the magnetic layer 2. For such spin injection layer 4, the antiferromagnetic material can be used or the ferri-magnetic material which has the net magnetic moment can be used too Thus, when the spin injection layer 4 is provided, the spin injection efficiency is improved. As the result, a high output power and high efficient spin-current thermoelectric conversion element 1 can be realized.

2. Manufacturing Method

Next, a method for manufacturing the spin-current thermoelectric conversion element 1 according to this exemplary embodiment will be described.

As a method for forming the magnetic layer 2, a sputter method, a metal-organic decomposition method (MOD method), a sol-gel method, an aerosol deposition method (AD method), a ferrite plating method, a liquid phase epitaxy method, a solid phase epitaxy method, a vapor phase epitaxy method, a dip method, a spray method, a spin coat method, a print method, or the like can be used. When these methods are used, the film of the magnetic layer 2 is formed on a support body. Further, as a method for forming the magnetic layer 2, a crystal pulling method, a magnetic insulator fiber manufacturing method using a fiber-drawing furnace, a sintering method, a fusion method, or the like can be used. In these cases, the magnetic layer 2 of a bulk body is formed.

As a method for forming the spin injection layer 4, a sputter method, a metal-organic decomposition method (MOD method), a sol-gel method, an aerosol deposition method (AD method), a ferrite plating method, a liquid phase epitaxy method, a solid phase epitaxy method, a vapor phase epitaxy method, a dip method, a spray method, a spin coat method, a print method, or the like can be used. Further, if the magnetic moment of the spin injection layer 4 can be made smaller than that of the magnetic layer 2, the film thickness of the spin injection layer 4 is not limited in particular.

As a method for forming the electromotive layer 3, a sputter method, a vapor deposition method, a plating method, a screen printing method, an ink jet method, a spray method, a spin coat method, or the like can be used. Further, coating and sintering of nano-colloidal solution may be performed. It is desirable to set the film thickness of the electromotive layer 3 to at least a spin diffusion length (a depth to which the spin-current reaches in the electromotive layer 3) or more. For example, it is desirable that when Au is used for the electromotive layer 3, the film thickness is set to 50 nm or more and when Pt is used, it is set to 10 nm or more. However, from a viewpoint of a cost, it is not necessary to needlessly increase the film thickness of the electromotive layer 3.

The electric power output terminal 5 can be formed by using an existing mounting technology appropriately. At least two electric power output terminals 5 exist. It is desirable to arrange the electric power taking out terminals 5 so that the maximum electromotive force generated in the electromotive layer 3 can be taken out.

The magnetic layer 2, the spin injection layer 4, the electromotive layer 3, and the electric power output terminal 5 can be formed in an arbitrary order. For example, the magnetic layer 2, the spin injection layer 4, the electromotive layer 3, and the electric power taking out terminal 5 can be formed in this order. Further, these layers can be formed in reverse order. As described later, a method in which the magnetic layer 2 and the electromotive layer 3 are formed in this order and then, the spin injection layer 4 is formed can be used.

3. Specific Example

Next, a specific example of this exemplary embodiment will be described.

3-1. First Example

In a first example, the spin-current induced thermoelectric conversion element 1 is produced on a crystalline substrate of gadolinium gallium garnet (GGG) with a thickness of 700 µm.

A bismuth-substituted yttrium iron garnet (Bi: YIG and it has a chemical formula of $BiY_2Fe_5O_{12}$) film is formed as the magnetic layer 2. The Bi: YIG film is formed by the metal-organic decomposition method (MOD method). MOD solution produced by Kojundo Chemical Laboratory Co., Ltd. is used. In this solution, metal materials with a proper mole fraction (Bi:Y:Fe=1:2:5) is dissolved in acetate ester at a concentration of 3% in a carboxylated state. The GGG substrate is coated with this solution by a spin coat process (a rotation speed is set to 1000 rpm for 30 seconds). After the spin coat process, it is dried by a hot plate at 150° C. for 5 minutes and then, a pre-annealing process is performed at 500° C. for 5 minutes. Lastly, an annealing process is performed by an electric furnace at a high temperature of 700° C. under an atmospheric air for 14 hours. As a result, a crystalline Bi:YIG film whose film thickness is about 65 nm is formed on a silica glass substrate.

A nickel oxide (NiO) film is formed as the spin injection layer 4. Specifically, the YIG film is coated with solution obtained by adding 0.1 g of Nickelocene to 10 ml of 1% PMMA (Mw=495 kDa) in anisole solvent by the spin coat process (a rotation speed is set to 3000 rpm for 1 minute). After this process, a sintering process is performed at 400° C. under an atmospheric air for 60 minutes. As a result, the thin nickel oxide film with a thickness of about 0.3 to 0.5 nm is formed.

The Pt film with a thickness of 10 nm is formed as the electromotive layer 3 by a sputter deposition process.

Figure 4:
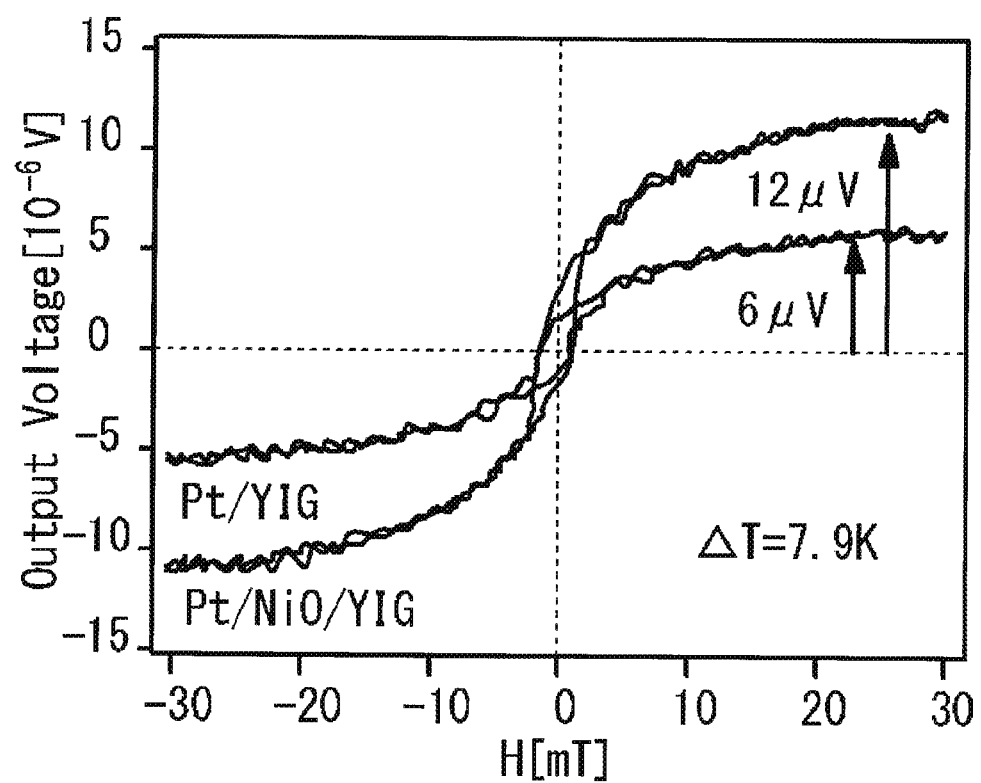
FIG. 4 shows one example of a measurement result of a characteristic of a thermoelectric conversion element according to an exemplary embodiment of the present invention.

After this process, the substrate is cut into 2×8 mm rectangular pieces to produce an element for evaluation. The thermoelectric conversion performance is measured by using the element for evaluation. FIG. 4 shows a result of the measurement. In this measurement, the temperature difference of 7.9K is applied to the whole element including the substrate in a thickness direction. In order to confirm the existence of a spin Seebeck signal, an external magnetic field is applied and a state in which the polarity of an output voltage reverses according to magnetization reversal of the element is measured. The spin Seebeck coefficient of this element is calculated by using the output voltage in the saturated state. As a result, in a case in which the spin injection layer 4 (NiO) exists, the spin Seebeck coefficient is calculated as 12.0 µV/7.9K=1.52 [µV/K]. As a comparison example, in a case in which the spin injection layer 4 (NiO) does not exist, the spin Seebeck coefficient is calculated as 6.0 µV/7.9K=0.76 [µV/K]. From the measurement result, by using this example, the spin Seebeck coefficient can be made almost double.

3-2 Second Example

In a second example, a silicon substrate with a thickness of 450 µm on which a thermal oxide of 20 nm thickness is formed is used. The magnetic layer 2 and the electromotive layer 3 are formed by the same manner as the first example.

The spin injection layer 4 is formed as follows. First, the YIG film is coated with solution of iron chloride or solution of nickel chloride by the spin coat process (a rotation speed is set to 3000 rpm for 1 minute). The concentration of iron chloride or nickel chloride used for this process is shown in table 1. After this process, the substrate is treated for 5 minutes under oxygen plasma generated in a condition in which the oxygen partial pressure is 50 Pa and the RF output power is 300 W. After the oxygen plasma treatment, it is expected that the iron chloride film or the nickel chloride film almost changes to iron oxide or nickel oxide and small amount of chlorine exists on the surface as impurities. The exact thickness of the iron oxide film or the nickel oxide film is not clear. However, it is estimated that it is very thin film with a thickness of 1 nm or less.

With respect to the second example, the element for evaluation is produced and the thermoelectric conversion performance is measured like the first example. Table 1 shows a result of the measurement. From table 1, it is clear that by introducing the spin injection layer 4 of the second example, the spin Seebeck coefficient increases and the maximum increase rate is 51%.

TABLE 1

| SOLUTION | CONCENTRATION µmol/ml | SPIN SEEBECK COEFFICIENT µV/K | INCREASE RATE % |
|---|---|---|---|
| (COATING IS NOT APPLIED) | — | 0.17 | — |
| IRON CHLORIDE | 34 | 0.22 | +29 |
| NICKEL CHLORIDE | 32 | 0.26 | +51 |

3-3. Third Example

In a third example, the Bi:YIG film of 65 nm thickness is formed on the crystalline substrate of gadolinium gallium garnet (GGG) with a thickness of 700 µm as the magnetic layer 2 like the first example described above.

Next, by using an electron beam evaporation deposition apparatus, a Ni film of 0.5 nm thickness is formed as a precursor of the spin injection layer 4 and then the Pt film of 10 nm thickness is formed as the electromotive layer 3 by the vapor deposition process. After this process, the sintering process is performed at 600° C. under an atmospheric air for 5 minutes. It is expected that the Ni film to which the sintering process is performed reacts to oxygen which transmits through the thin Pt film and oxygen which originally exists in the magnetic layer 2 and changes to a dense nickel oxide film.

As a result, the output voltage obtained when the spin injection layers 4 exists is 1.5 to 2.5 times greater than the output voltage obtained when the spin injection layers 4 does not exist.

The exemplary embodiment of the present invention has been explained above by referring to the accompanying drawing. However, the invention of the present application is not limited to the above mentioned exemplary embodiment. Various changes or details of the invention of the present application can be made without departing from the scope of the invention of the present application by those skilled in the art.

A part of or all of the above-mentioned exemplary embodiment can be described as the following supplementary note. However, the present invention is not limited to the following supplementary note.

(Supplementary Note 1) A thermoelectric conversion element including a magnetic layer which has a component magnetized in an in-plane direction, an electromotive layer which includes a material with spin orbit coupling, and a spin injection layer which is provided between the magnetic layer and the electromotive layer and magnetically coupled to both the magnetic layer and the electromotive layer, wherein a magnetic moment per unit volume of the spin injection layer is smaller than the magnetic moment per unit volume of the magnetic layer.

(Supplementary Note 2) The thermoelectric conversion element described in supplementary note 1 wherein the spin injection layer is made of an antiferromagnetic material.

(Supplementary Note 3) The thermoelectric conversion element described in supplementary note 1 wherein the spin injection layer is made of a ferrimagnetic material.

(Supplementary Note 4) The thermoelectric conversion element described in any one of supplementary notes 1 to 3 wherein at least one of an up-spin density and a down-spin density of the spin injection layer is greater than a corresponding spin density of the magnetic layer.

(Supplementary Note 5) The thermoelectric conversion element described in any one of supplementary notes 1 to 4 wherein the magnetic layer is made of a ferromagnetic metal and the spin injection layer is made of an insulating material.

(Supplementary Note 6) A method for manufacturing a thermoelectric conversion element comprising a step in which a magnetic layer which has a component magnetized in an in-plane direction is formed, a step in which an electromotive layer which includes a material with spin orbit coupling is formed, and a step in which a spin injection layer is formed, wherein the spin injection layer is formed between the magnetic layer and the electromotive layer and magnetically coupled to both the magnetic layer and the electromotive layer and a magnetic moment per unit volume of the spin injection layer is smaller than the magnetic moment per unit volume of the magnetic layer.

This application claims priority based on Japanese Patent Application No. 2012-200535, filed on Sep. 12, 2012, the disclosure of which is hereby incorporated by reference in its entirety.

The invention claimed is:

1. A thermoelectric conversion element including a magnetic layer which has a component magnetized in an in-plane direction, an electromotive layer which includes a material with spin orbit coupling, and a spin injection layer which is provided between the magnetic layer and the electromotive layer and magnetically coupled to both the magnetic layer and the electromotive layer, wherein a magnetic moment per unit volume of the spin injection layer is smaller than a magnetic moment per unit volume of the magnetic layer.

2. The thermoelectric conversion element described in claim 1 wherein the spin injection layer is made of an antiferromagnetic material.

3. The thermoelectric conversion element described in claim 1 wherein the spin injection layer is made of a ferrimagnetic material.

4. The thermoelectric conversion element described in claim 1, wherein at least one of an up-spin density and a down-spin density of the spin injection layer is greater than a corresponding spin density of the magnetic layer.

5. The thermoelectric conversion element described in claim 1 wherein the magnetic layer is made of a ferromagnetic metal and the spin injection layer is made of an insulating material.

6. A method for manufacturing a thermoelectric conversion element comprising a step in which a magnetic layer which has a component magnetized in an in-plane direction is formed, a step in which an electromotive layer which includes a material with spin orbit coupling is formed, and a step in which a spin injection layer is formed, wherein the spin injection layer is formed between the magnetic layer and the electromotive layer and magnetically coupled to both the magnetic layer and the electromotive layer and a magnetic moment per unit volume of the spin injection layer is smaller than the magnetic moment per unit volume of the magnetic layer.

\* \* \* \* \*